Dec. 14, 1965 R. CHARBONNIER 3,223,853

ELECTRONIC BISTABLE CIRCUIT

Filed Dec. 20, 1962

United States Patent Office 3,223,853

Patented Dec. 14, 1965

3,223,853
ELECTRONIC BISTABLE CIRCUIT

Roger Charbonnier, Meudon, France, assignor to Rochar Electronique, Montrouge (Seine), France, a corporation of France Filed Dec. 20, 1962, Ser. No. 246,267
Claims priority, application France, Dec. 26, 1961, 883,064, Patent 1,317,269
4 Claims. (Cl. 307—88.5)

The present invention relates to an electronic bistable circuit capable of operating at particularly high switching frequencies.

Such bistable circuits generally comprise two alternately conductive and non-conductive electronic amplifier units, and means for applying thereto electric pulses adapted to switch the conductive state from one unit to the other.

When it is required to obtain high switching frequencies, such as for instance for counting pulses having repetition frequencies of the order of several tens of megacycles, transistors are generally used as amplifier units, since they present a much higher transconductance than tubes, and comparatively small shunting capacities: the higher transductance enables to obtain, with a low load resistance, a feedback gain of the loop which includes the two amplifier units, which will be high enough for the reversal to be suitably effected. As is known, the switching frequencies are ultimately limited by time constants, one of which is the product of said load resistance and the shunting capacity of the base electrode of the transistor considered. Therefore, the use of transistors enables one to increase switching rate of such bistable circuits.

It is also known, for further increasing said switching rate, to steer the trigger input pulses to the proper trigger transistor to cause reversal, by means of a pair of auxiliary gating transistors.

Since the present technique requires increasingly high switching frequencies, important difficulties are encountered, which will be specified hereinafter and which are substantially minimized by the use of the present invention.

It is an object of this invention to provide a bistable circuit comprising a pair of main trigger transistors and a pair of auxiliary gating transistors, said bistable circuit further including a further pair of auxiliary transistors, one of which feeds the gating pair with triggering current signals, and the other feeds the trigger pair with triggering current signals, the sum of the triggering currents which feed said further pair of auxiliary transistors being substantially constant.

Another object is to provide a bistable circuit wherein a resistor inductor Boucherot type circuit (as defined hereunder) is connected in the base circuit of each of said main trigger transistors.

Figure 1:
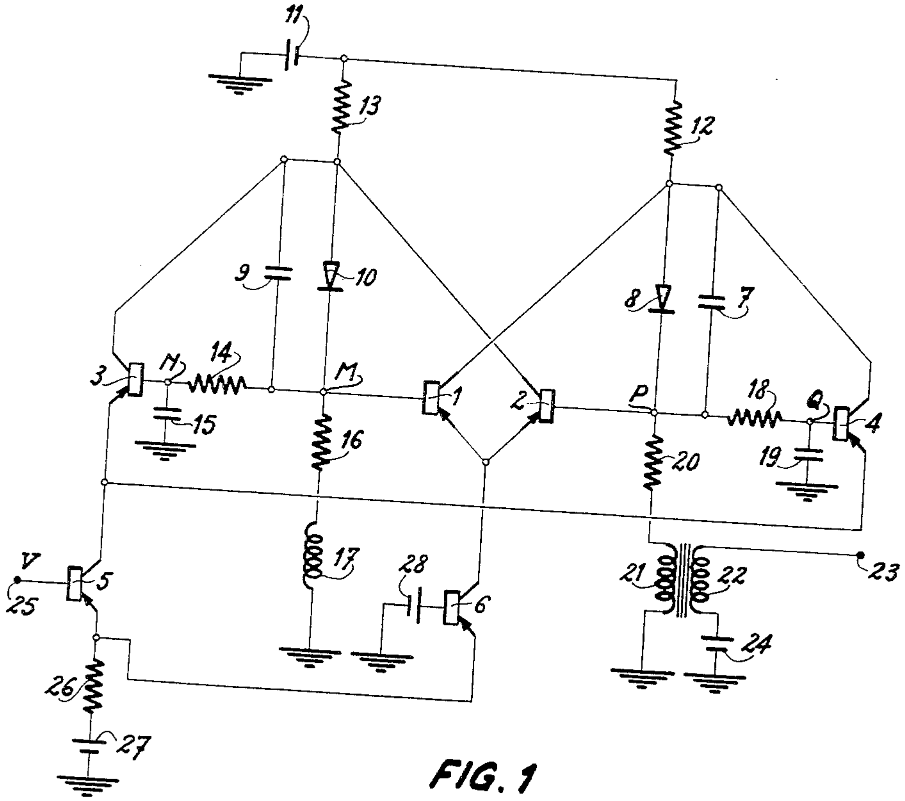
Figure 2:
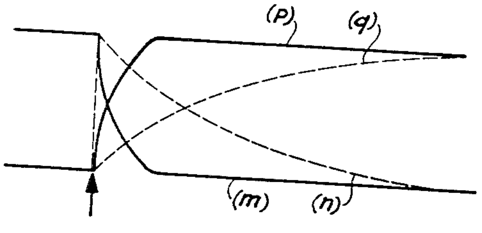

Other objects and advantages of this invention will become apparent from the following description and appended drawings, wherein:

FIGURE 1 is a wiring diagram of a bistable circuit arrangement according to the invention; and FIGURE 2 represents waveforms which are illustrative of the operation of the device shown in FIGURE 1.

Referring first to FIGURE 1, a bistable circuit is shown, in one stable state of which a transistor 1 is conducting (as shown in the figure), whereas a second transistor 2 is cut off. The collector electrode of transistor 1 is connected to the base electrode of transistor 2 by a capacitor 7 arranged in parallel across an avalanche or Zener diode 8. Similarly, the collector of transistor 2 is connected to the base electrode of transistor 1 by a capacitor 9 connected in parallel with a Zener or avalanche diode 10.

It will be explained later in this description the reason why avalanche diodes are substituted for the usual resistances mounted in this point in a conventional Eccles-Jordan flip-flop circuit.

The collector electrodes of transistors 1 and 2 are connected to the negative terminal of a D.C. voltage source 11, through resistances 12 and 13, respectively.

The emitter electrodes of transistors 1 and 2 are connected to the collector electrode of transistor 6.

The base of transistor 1 is connected: to the base of transistor 3 through a resistance 14; to ground through a resistance 16 substantially equal in value to resistance 14, in series with an inductance coil 17. The base of transistor 3 is grounded through a capacitor 15. According to a particular feature of this invention, the self-inductance of coil 17 is equal to the product of the capacitance of capacitor 15 and the square of the resistance value of resistor 14 (or 16).

The collector electrode of transistor 3 is connected, at the junction point of diode 10, capacitor 9 and resistor 13.

The base of transistor 2 is, similarly, connected to the base of transistor 4 through resistance 18 and grounded through a resistance 20 which is substantially equal in value to resistance 18, and an inductance coil 21, whereas the base of transistor 4 is grounded through a capacitor 19. According to a particular feature of this invention, the self-inductance of coil 21 is equal to the product of the capacitance of capacitor 19 and the square of the resistance value of resistance 18.

Coil 21 is coupled to a coil 22 connected at one end to terminal 23 and on the other end to the positive pole of a battery 24, the negative pole of which is grounded.

The emitter electrodes of transistors 3 and 4 are connected to the collector of transistor 5, the base of which is connected to a terminal 25. The emitter electrodes of transistors 5 and 6 are connected, through a resistance 26, to the positive pole of a battery 27, the negative pole of which is grounded.

The base of transistor 6 is connected to the positive pole of a battery 28, the negative pole of which is grounded.

The operation of the circuit arrangement just described is as follows:

Assuming, for instance, at a given instant, transistor 1 to be conducting, transistor 2 will be cut off.

The current delivered by transistor 1 is supplied by battery 27 through resistance 26, the value of which is high relative to the resistances between the emitter and collector electrodes of the transistors, and through transistor 6 which, at said instant, is also conducting. Transistor 5 will then be cut off on account of the voltage drop due to the flow of the current through resistance 26: transistors 3 and 4 are thus also cut off. If a negative pulse of a suitable amplitude is now applied to terminal 25, transistor 5 will deliver a current pulse.

As soon as transistor 5 becomes conductive, transistor 6—and consequently transistor 1—is cut off. In effect, transistors 5 and 6 are fed by the substantially constant current flowing through resistance 26, and thus it may be arranged (for instance by applying a high negative bias to the base of transistor 5), for the output of transistor 5 to cause transistor 6 to be cut off.

Moreover, since transistor 1 was conducting and transistor 2 blocked at the instant of applying the voltage pulse, the voltage at the base of transistor 3 (point N) was more negative than that of transistor 4 (point Q).

Since transistors 3 and 4 are identical and symmetrically connected in circuit, it follows that transistor 3 will exclusively transmit the current pulse.

The passage of this pulse through diode 10 and resistance 16 causes an increase of the base potential of transistor 1, point P thus becoming more negative than point M.

It thus follows, at the end of the pulse, when the current output supplied by source 27 is transferred from transistor 5 to transistor 6, that it is now transistor 2 which will transmit said current: the switching of the bistable device is then achieved.

The operation of the device as briefly described hereinabove will now be submitted to a more detailed analysis, in order to stress the particular features and advantages of the circuit arrangement described.

It may be considered that this circuit arrangement comprises, in the same way as various circuit arrangements adapted to operate at high switching frequencies, two main trigger transistors (1 and 2) and two auxiliary gating transistors (3 and 4), the latter transistors ensuring, as is known, the correct steering of the wavefronts to the proper transistor to cause reversal of the bistable circuit.

A basic feature of the invention lies in the method consisting in separately injecting the current into the main transistors of the bistable device and into the gating transistors thereof, by means of two respective auxiliary transistors which are fed by a substantially constant total current. Due to this feature, the sum of the currents injected into the two pairs of transistors (namely the main trigger transistors and the gating transistors), is substantially constant and, the current being switched by the trigger pulse, from the first to the second pair, it follows that the voltage at M (or at P) remains equally substantially constant as soon as the switching action is achieved: in other words, the signals collected at the output of the circuit are not distorted by the pulses transmitted by the gating transistors.

Such a distortion would occur in the absence of this feature of the invention, since a pulse, transmitted by the gating transistors, would be superimposed on the signal derived from the reversal proper.

Under these conditions, the output signal of the bistable device would be unsuitable for driving the next bistable stage of a counter arrangement comprised of a plurality of serially connected bistable stages of the type disclosed.

In contradistinction therewith, in the bistable device described, the signals at points M and P are substantially rectangularly shaped and the signal at the terminals of the coil 21 is substantially equal to the derivative of the signal at point P. It therefore occurs in the shape of non distorted pulses and may be transmitted by coil 22 to the base of the input transistor of the following bistable stage of a counter arrangement.

It is to be stressed that the above mentioned advantage enables one to substantially increase the switching frequency of a device including a plurality of series connected bistable stages, such as a counter for instance.

Generally, when it is required to increase the switching frequency of devices such as described above, two main difficulties are met with.

The first consists in the requirement to satisfy the "storage function" (which consists in that the bistable device, at the instant of applying new trigger pulse, must, as it were, have stored up the electric condition resulting from the application of the preceding pulse, in order that it may switch over reliably into the opposite state) and the requirement to have a comparatively short "recovery time" (i.e. to recover very rapidly, after a reversal caused by the application of a pulse, its responsiveness with respect to the following pulse).

In the device disclosed, the first mentioned difficulties are met with by using, for performing the above indicated storage function, a pair of gating transistors which, as shown above, steers the reversing pulse to the left or to the right according to the previous state of the bistable device (which is known per se) and further by delaying, in a manner to be shown later in the description, the wavefronts transmitted in the circuit so that these may not affect the already initiated turn-over.

Another difficulty is that a high maximum switching frequency is to be obtained from the main transistors of the bistable device.

This requires that the load of said transistors include as low a capacitance and a resistance as possible.

If, however, the load resistance of these transistors is small, the feedback gain of the bistable device is low (although the transductance of the transistors is high) and the trigger input voltage of the bistable device must be comparatively high: under these conditions, the trigger pulse must not be transmitted to the output of the circuit it has been shown above how, according to the invention, this is avoided, thus enabling to impart a small value to the load resistance of the main transistors of the bistable device.

According to another feature of the invention, the load of each one of said transistors consists of a so-called "Boucherot" circuit. The term Boucherot circuit in the specification and in the claims relates to a circuit essentially consisting of first and second circuit portions each comprising a resistance R and a reactance, one of said reactances being a capacitance C and the other an inductance L, so that $$L=CR^2$$

According to a first embodiment the resistance and the reactance are connected in parallel in each of said circuit portions and the two circuit portions are connected in series. According to a second embodiment, which is illustrated in FIGURE 1, the resistance and the reactance are connected in series in each of said circuit portions and the two circuit portions are connected in parallel. These two embodiments are dual to each other and show the same feature, namely that the impedance of the Boucherot circuit is a resistance equal to the resistance R which is induced in each of its two circuit portions. In the example illustrated in FIG. 1 the load circuit of transistor 2 comprises for instance a first circuit portion 14–15 and a second circuit portion 16–17 and the circuit impedance, as seen from point M of the junction between these two circuit portions, is a pure resistance equal to one of the circuit resistances. It follows from this property of the "Boucherot circuit" that the collector electrode of transistor 2 is loaded by a pure resistance in parallel across its base capacity. Thus, the effect of the base capacity of transistor 3 and of the capacitor 15, which would interfere, in the absence of this feature of the invention, in the load of transistor 2, is eliminated. Utimately, the invention enables the turn-over time of the transistors of the bistable device to be reduced, by reducing both their load capacitance and their load resistance.

It has been mentioned hereinabove that the wavefronts transmitted in the circuit arrangement are delayed, so as to avoid the already initiated turn-over to be affected. This delay—or storage—function is carried out precisely by said "Boucherot" circuit. Considering the application of a pulse to the terminal 25 in the operating stage as described hereinabove, and examining the evolution of the potentials at points M, N, P, Q (the respective waveforms of which are *m, n, p, q,* FIGURE 2), it is seen that the evolution of the base potentials of the gating transistors, from the instant of application of the pulse—as indicated by an arrow—is delayed with respect to the evolution of the base potentials of the main transistors.

It follows that the turn-over of the main transistors is definitely completed before the gating transistors will be able to transmit the wavefronts which might affect said turn-over.

It also follows that the gating transistors are not responsive to a new pulse before a recovery time has elapsed which will be only of the order of magnitude of the product of the resistance of each "Boucherot" circuit and the load capacitance of each gating transistor.

It is to be noted, on the other hand, that owing to the presence of the avalanche or Zener diodes 8 and 10, the D.C. potential difference which must exist between the bases and the collectors of the transistors of the bistable device is obtained without imposing thereto an additional A.C. load.

It is of course possible to carry out many detail modifications and variations, without departing from the spirit and scope of the invention. In particular, it is possible to use n-p-n transistors instead of p-n-p transistors, provided that the polarities be suitably modified.

What I claim is:

1. A bistable circuit including: first, second, third, fourth, fifth and sixth transistors each having a base, a collector and an emitter electrode, the emitter electrodes of said first and second transistors being connected in common to the collector electrode of said sixth transistor; means, connected in common to the emitter electrodes of said fifth and sixth transistors for supplying the same with a substantially constant current; the base electrode of said fifth transistor being adapted for receiving a pulse input signal, the collector electrode of said fifth transistor being connected in common to the emitter electrodes of said third and fourth transistors; a first impedance circuit connecting the base electrode of said first transistor to the base electrode of said third transistor; a second impedance circuit connecting the base electrode of said second transistor to the base electrode of said fourth transistor; a third impedance circuit connecting the collector electrode of said second transistor to the base electrode of said first transistor; and a fourth impedance circuit connecting the collector electrode of said first transistor to the base electrode of said second transistor, said first and second transistors being thus arranged in a common emitter circuit configuration and having their bases and collectors conductively cross-connected through said third and fourth impedance circuits whereby said first and second transistors form a trigger pair having two stable states of operating condition, said third and fourth transistors forming a gating pair, said pulse input signal controlling the transfer of the flow of said constant current to said fifth and sixth transistors and, therefore, respectively to said gating pair and said trigger pair, said gating pair then being adapted for controlling the biasing potentials of said trigger pair so as to prepare the switching thereof from one stable state to the other.

2. A bistable circuit including: first, second, third, fourth, fifth and sixth transistors each having a base, a collector and an emitter electrode, the emitter electrodes of said first and second transistors being connected in common to the collector electrode of said sixth transistor; means, connected in common to the emitter electrodes of said fifth and sixth transistors for supplying the same with a substantially constant current; the base electrode of said fifth transistor being adapted for receiving a pulse input signal, the collector electrode of said fifth transistor being connected in common to the emitter electrodes of said third and fourth transistors; a first impedance circuit connecting the base electrode of said first transistor to the base electrode of said third transistor; a second impedance circuit connecting the base electrode of said second transistor to the base electrode of said fourth transistor; a capacitor-avalanche diode parallel circuit arrangement connecting the collector electrode of said second transistor to the base electrode of said first transistor; and a capacitor-avalanche diode parallel circuit arrangement connecting the collector electrode of said first transistor to the base electrode of said second transistor; said first and second transistors being thus arranged in a common emitter circuit configuration and having their bases and collectors conductively cross-connected through said third and fourth impedance circuits whereby said first and second transistors form a trigger pair having two stable states of operating condition, said third and fourth transistors forming a gating pair, said pulse input signal controlling the transfer of the flow of said constant current to said fifth and sixth transistors and, therefore, respectively to said gating pair and said trigger pair, said gating pair then being adapted for controlling the biasing potentials of said trigger pair so as to prepare the switching thereof from one stable state to the other.

3. A bistable circuit including: first, second, third, fourth, fifth and sixth transistors each having a base, a collector and an emitter electrode, the emitter electrodes of said first and second transistors being connected in common to the collector electrode of said sixth transistor; means, connected in common to the emitter electrodes of said fifth and sixth transistors for supplying the same with a substantially constant current; the base electrode of said fifth transistor being adapted for receiving a pulse input signal, the collector electrode of said fifth transistor being connected in common to the emitter electrodes of said third and fourth transistors; a first impedance circuit connecting the base electrode of said first transistor to the base electrode of said third transistor, said first impedance circuit being a Boucherot circuit including two circuit portions connected in parallel; a second impedance circuit connecting the base electrode of said second transistor to the base electrode of said fourth transistor, said second impedance circuit being a Boucherot circuit including two circuit portions connected in parallel; a third impedance circuit connecting the collector electrode of said second transistor to the base electrode of said first transistor; and a fourth impedance circuit connecting the collector electrode of said first transistor to the base electrode of said second transistor, said first and second transistors being thus arranged in a common emitter circuit configuration and having their bases and collectors conductively cross-connected through said third and fourth impedance circuits whereby said first and second transistors form a trigger pair having two stable states of operating condition, said third and fourth transistors forming a gating pair, said pulse input signal controlling the transfer of the flow of said constant current to said fifth and sixth transistors and, therefore, respectively to said gating pair and said trigger pair, said gating pair then being adapted for controlling the biasing potentials of said trigger pair so as to prepare the switching thereof from one stable state to the other.

4. A bistable circuit including: first, second, third, fourth, fifth and sixth transistors each having a base, a collector and an emitter electrode, the emitter electrodes of said first and second transistors being connected in common to the collector electrode of said sixth transistor; means, connected in common to the emitter electrodes of said fifth and sixth transistors for supplying the same with a substantially constant current; said base electrode of said fifth transistor being adapted for receiving a pulse input signal, the collector electrode of said fifth transistor being connected in common to the emitter electrodes of said third and fourth transistors; a first impedance circuit connecting the base electrode of said first transistor to the base electrode of said third transistor, said first impedance circuit being a Boucherot circuit including two circuit portions connected in parallel; a second impedance circuit connecting the base electrode of said second transistor to the base electrode of said fourth transistor, said second impedance circuit being a Boucherot circuit including two circuit portions connected in parallel; a capacitor-avalanche diode parallel circuit arrangement connecting the collector electrode of said second transistor to the base electrode of said first transistor; and a capacitor-avalanche diode parallel circuit arrangement connecting the collector electrode of said first transistor to the base electrode of said second transistor, said first and second transistors being thus arranged in a common emitter circuit configuration and having their bases and collectors conductively cross-connected through said third and fourth impedance circuits whereby said first and second transistors form a trigger pair having two stable states of operating condition, said third and fourth transistors forming a gating pair, said pulse input signal controlling the transfer of the flow of said constant current to said fifth and sixth transistors and, therefore, respectively to said gating pair and said trigger pair, said gating pair then being adapted for controlling the biasing potentials of said trigger pair so as to prepare the switching thereof from one stable state to the other.

References Cited by the Examiner

UNITED STATES PATENTS

| | | | |
|---|---|---|---|
| 2,997,605 | 8/1961 | Fortini | 307—88.5 |
| 3,083,304 | 3/1963 | Spriestersbach et al. | 307—88.5 |
| 3,114,053 | 12/1963 | Robinson | 307—88.5 |

JOHN W. HUCKERT, *Primary Examiner.*

DAVID J. GALVIN, *Examiner.*